United States Patent [19]
Covino et al.

[11] Patent Number: 5,559,453
[45] Date of Patent: Sep. 24, 1996

[54] INTERLOCKED RESTORE CIRCUIT

[75] Inventors: James J. Covino, Essex; Jose R. Sousa, Colchester, both of Vt.

[73] Assignee: International Business Machines Corporation, Armonk, N.Y.

[21] Appl. No.: 534,920

[22] Filed: Sep. 28, 1995

[51] Int. Cl.⁶ ................................................ H03K 19/01
[52] U.S. Cl. ............................ 326/93; 326/21; 326/121
[58] Field of Search ............................ 326/21, 93, 94, 326/96, 98, 121

[56] References Cited

U.S. PATENT DOCUMENTS

| | | |
|---|---|---|
| 3,961,138 | 6/1976 | Fellinger . |
| 4,006,465 | 2/1977 | Cross et al. . |
| 4,035,626 | 7/1977 | Christensen . |
| 4,412,329 | 10/1983 | Yarborough, Jr. . |
| 4,477,904 | 10/1984 | Thorsrud . |
| 4,763,249 | 8/1988 | Bomba et al. . |
| 5,121,003 | 6/1992 | Williams ................................. 326/121 |
| 5,307,356 | 4/1994 | Fifield . |
| 5,343,090 | 8/1994 | Proebsting ......................... 326/121 X |
| 5,377,334 | 12/1994 | Boldt et al. . |
| 5,382,844 | 1/1995 | Knauer ................................... 326/121 |
| 5,384,906 | 1/1995 | Horst . |
| 5,434,520 | 7/1995 | Yetter et al. ............................. 326/93 |
| 5,517,136 | 5/1996 | Harris et al. ............................. 326/93 |

*Primary Examiner*—David R. Hudspeth
*Attorney, Agent, or Firm*—Whitham, Curtis, Whitham & McGinn; Howard J. Walter

[57] ABSTRACT

A low power, high speed, multistage asynchronous logic circuit having an interlocked restore mechanism. A first logic circuit detects a valid input signal and drives an output to a second logic circuit. The second logic circuit receives inputs from the first logic circuit and drives a data ready signal back to the first logic circuit when it detects the output from the first logic circuit. The first logic circuit resets when it receives the data ready signal from the second logic circuit and it detects that its inputs have been reset.

7 Claims, 2 Drawing Sheets

INTERLOCKED RESTORE CIRCUIT

BACKGROUND OF THE INVENTION

1. Field of the Invention

The present invention generally relates to logic stages, and, more particularly, to an interlocked restore circuit to ensure sufficient overlap of pulses traveling along different paths to a logic circuit.

2. Description of the Related Art

Clocks are needed in logic arrays to decide when an element that contains a binary logic state, either zero or one, should be updated. In a synchronous system, the signals that are written into state elements must be valid when the clock edge occurs. A signal is valid if it is stable (i.e., not changing) and the value will not change again until the input changes.

One factor to be considered in designing logic circuits is clock skew. Clock skew is the difference in absolute time between when two logic elements see a clock edge. Clock skew arises because the clock signal will often use two different paths, with slightly different delays, to reach two different state elements. These delays may result from factors such as different resistor/capacitor (RC) values along the path.

Therefore, pulsed signals traveling along different paths with different delays can arrive at a logic block without sufficient overlap to produce the correct evaluation. To avoid incorrect operation, the clock period is typically increased to allow for the maximum clock skew as well as the clock set-up and hold time.

In an asynchronous system, however, merely increasing the clock period will not solve the problem. One solution is to wait for a period that is several times longer than the set-up time. Besides slowing the system response time, an additional drawback is that there is still a possibility of insufficient overlap at the input to the logic block to produce a correct result.

In light of the foregoing, there exists a need for an asynchronous logic circuit arrangement and method that provides for sufficient overlap of pulses at a logic circuit regardless of the pulse path.

SUMMARY OF THE INVENTION

The present invention is directed to a multistage asynchronous logic circuit and interlocked restore method, which substantially obviates one or more of the problems due to the limitations and disadvantages of the related art.

The present invention provides for a series of logic blocks, arranged using feedback restores and interlocks so that path timings are not as critical. Each logic block is designed to interlock with the previous and next logic blocks. A receiving logic block cannot be restored until its inputs have been restored and a reset signal has been received from the next logic block. A logic block generates a reset signal when output of data from that block occurs.

Using this technique, two signals travelling along two different delay paths will have the necessary overlap at the input of a logic block. The apparatus and method may be replicated for a multistage path, making sure that each stage is properly evaluated.

To achieve these and other advantages and in accordance with the purpose of the invention, as embodied and broadly described, the invention provides for a low power, high speed, multi-stage asynchronous logic circuit, comprising a first logic circuit having a plurality of inputs and an output, the first logic circuit having means for detecting the presence of valid data at its inputs and means for generating a logic output signal; a second logic circuit having means for detecting the presence of the logic output signal and means for generating a data ready signal; and means for coupling the data ready signal to the first logic circuit for resetting the output of the first logic circuit when the inputs of the first logic circuit have been restored.

In another aspect, the invention is an interlocked restore method for a multistage asynchronous logic circuit having at least first and second logic circuits with respective inputs and outputs, the method comprising the steps of: detecting, by the first logic circuit, the presence of valid data at its inputs; generating a logic output signal from the first logic circuit; detecting, by a second logic circuit, the presence of the logic output signal; generating a data ready signal from the second logic circuit; and coupling the data ready signal to the first logic circuit for resetting the first logic circuit and its output when the inputs of the first logic circuit have been restored.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The invention is described below in the context of an exclusive-or (XOR) tree of a parity check circuit. It is understood that the apparatus and method of the present invention may be used in a wide variety of integrated circuit applications that utilize logic functions requiring a cascade of logic blocks, for example, timing chains or data paths. Moreover, the invention is not limited to the use of XOR logic circuits, but may be practiced using AND, OR, NAND, NOR or other different logic blocks, and combinations thereof.

Figure 1:
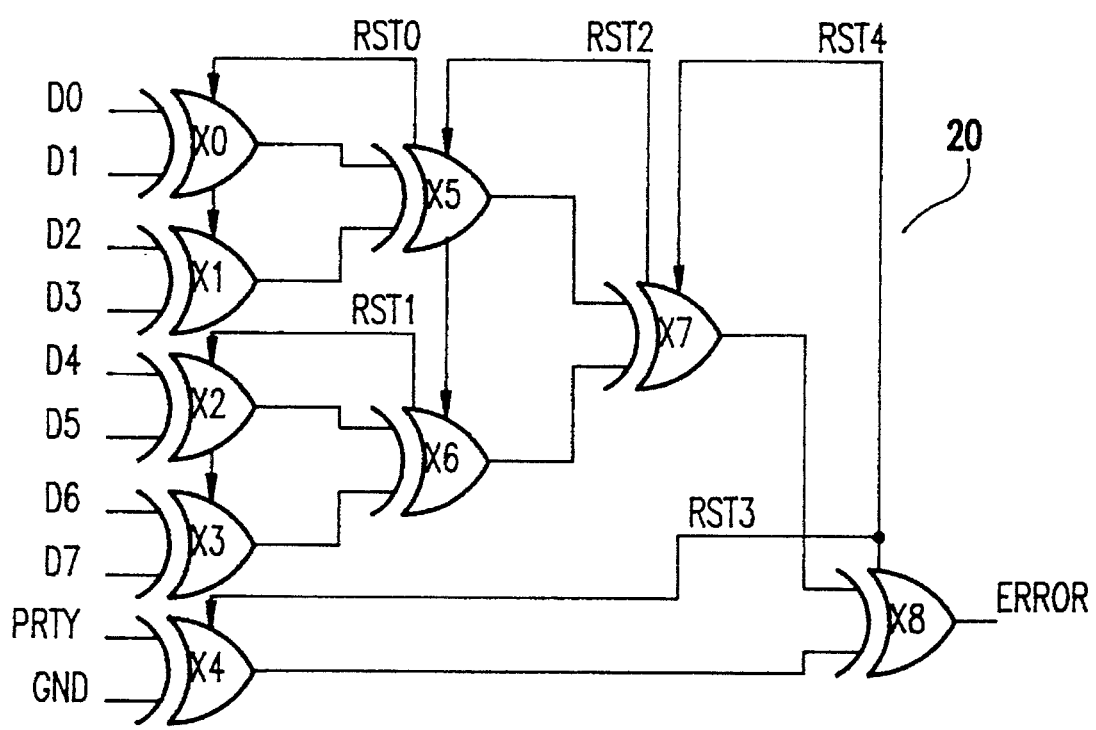
FIG. 1 is a parity check circuit block diagram utilizing the present invention.

Referring now to the drawings, and more particularly to FIG. 1, there is shown a parity check circuit logic diagram 20 incorporating the present invention. In this exemplary parity check circuit, eight data bits are checked against a single parity bit.

In a one-bit parity code the number of binary 1's in a data word are counted. The word has 'even' parity if the number of 1's including the parity bit is even and 'odd' parity otherwise. When a word is written into memory, the parity bit is also written. The parity bit is read and checked when the word is read out. If the stored and checked parity bits do not match, an error is detected. A one-bit parity code can detect at most one bit of error in the data item.

An 'even' parity algorithm is illustrated in FIG. 1. In other words, the ERROR output remains low, indicating no errors, as long as an even number of inputs, including the parity bit PRTY, are active high. It is understood that an 'odd' parity scheme may also be used within the practice of this invention.

All of the input signals, D0–D7 and PRTY, are DC or pulsed signals that have to propagate through the exclusive-or (XOR) tree towards a single output. As is well known, in an XOR function, the output is logically true "1" if either of the inputs is logically true "1", but not if both are true. If both inputs are logically false "0" then the output is false as well. As shown in FIG. 1, the signal inputs D0–D7 will take significantly more time to combine and arrive at X8 than the PRTY signal.

In order to guarantee that both inputs to X8 have enough overlap to ensure a proper evaluation, an interlocked restore scheme in accordance with the present invention is utilized.

Generally, the interlocked restore scheme ensures that X4 and X7 do not restore their outputs until the restore signal RST3 is sent from X8. The restore signal RST3 acknowledges the proper reception of inputs, and completion of the XOR function at XS. Applying this interlocked restore mechanism to the other XOR gates using reset signals RST0–RST2 ensures that the circuit will function properly independently of any clock skew that may occur between any two data paths or difference in delay on all required paths.

In multi-stage operation, when output from a second, downstream asynchronous XOR circuit occurs, a data ready signal is generated and sent to the first, upstream asynchronous XOR circuit via a feedback path that restores the first XOR. Upstream and downstream are relative terms with respect to any two XORs in the circuit. Upstream refers to the XOR located closer to the data input while downstream refers to the XOR located closer to the output.

The multi-stage asynchronous circuit of FIG. 1 will now be described in greater detail with respect to FIG. 2, which is a more detailed schematic view of the XOR gate and its operation. It is understood that each of the XOR circuits X0–X8 functions in a similar manner.

Each XOR circuit has input, output, reset-in and reset-out nodes. Both the inputs and the output of this XOR are differential true/complement pairs. In Table 1 below, the three valid logic states and how they relate to the true and complement pins is shown:

TABLE 1

| Truth Table for Differential Logic | | |
| --- | --- | --- |
| STATE | TRUE | COMPLEMENT |
| 0 | 0 | 1 |
| 1 | 1 | 0 |
| Standby | 0 | 0 |

The operation of the circuit will now be described. It is assumed that the XOR logic gate is in standby mode, that is, both TRUE and COMP outputs are low. Valid data (zero "0" or one "1") arrives at inputs A (AT-AC) and B (BT-BC) as DC or pulsed signals. By valid data it is meant that both A and B are a logic "0" or "1", and that both, if pulsed, have sufficient overlap to set the internal latches L1 and L2 of the XOR. When the gates of the NFETs T0–T5 are "0" they open the path to ground of nodes 31 and 32. The data on nodes 31 and 32 is held by latches L1 and L2 until RSTIN restores the circuit by turning on PFETs T6, T7, and NFETs T10, T11.

Continuing on, outputs TRUE and COMP are set according to the input value (see Table 1) and RSTOUT goes high by means of NOR NR20 and inverter I5. This RSOUT high signal is sent to the logic gates that supplied the A and B inputs to acknowledge the reception of valid data.

Figure 2:
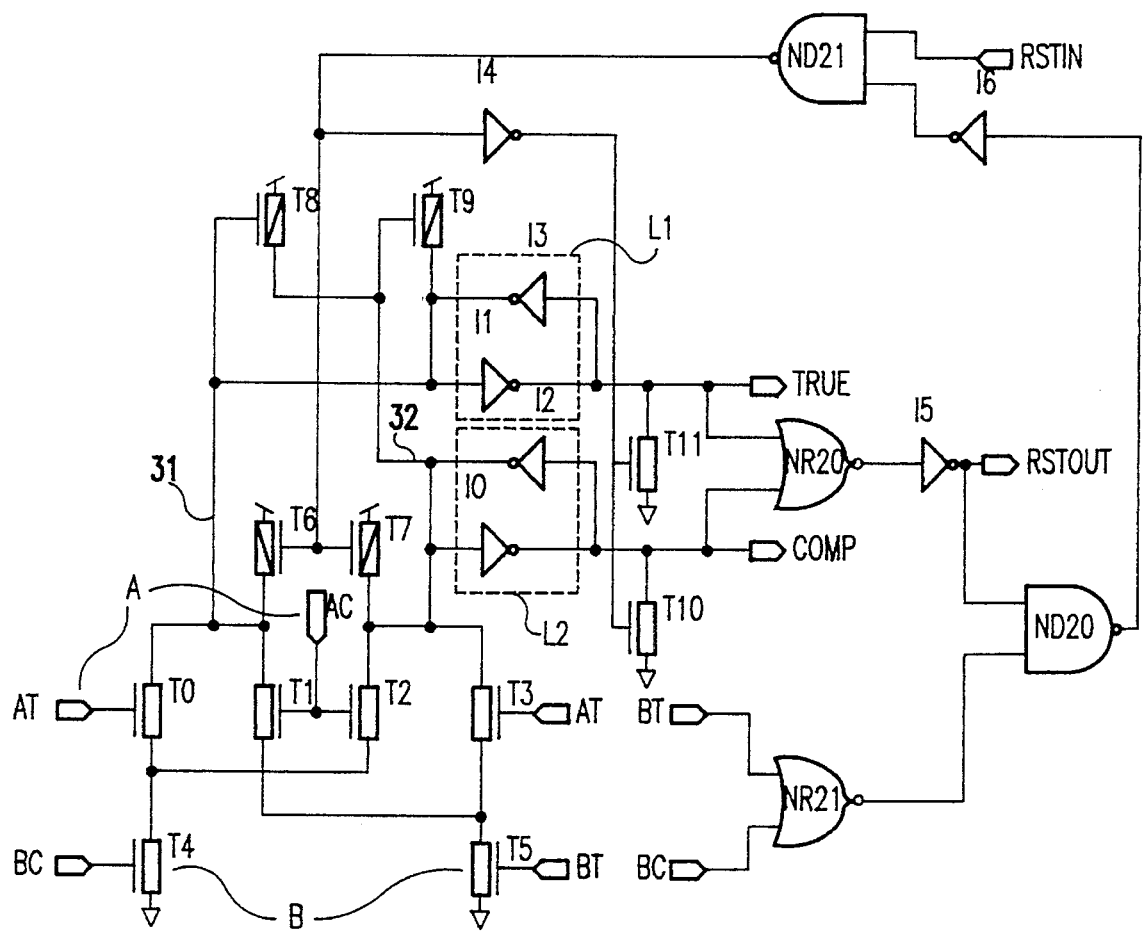
FIG. 2 is a schematic diagram of an exclusive-or (XOR) gate.

As soon as one of the inputs goes to standby, in this case the B input as shown in FIG. 2, the output of NOR NR21 goes high. This signal, combined with RSTOUT, enables NAND ND21 to place the XOR in standby mode (restored) as soon as RSTIN goes high. The RSTIN signal is therefore the RSTOUT signal of a downstream XOR that is supplied to an upstream XOR sending one of the A or B inputs. For example, referring back to FIG. 1, the RSTOUT signal of X7 is the RSTIN signal of X5 and X6. When the XOR returns to standby mode, RSTOUT becomes a logic "0".

Actual data output from the second, downstream asynchronous XOR circuit occurs upon latching of data in the first, upstream asynchronous circuit. Note that restore of the receiving latches cannot occur when data is present at the input, and restore will not occur until data has been received by the subsequent stage. Also note that either or both of the inputs A and B can be put in a standby state without disturbing the data at the output because the selected path drives into NFETs T0–T5. This allows earlier stages in the parity tree to be restored without affecting other gates downstream.

Thus the XOR is a self-restore circuit interlocked with the states of the previous and following logic stages. The reset-out signal (RSTOUT) is generated at each XOR as soon as an output state of "0" or "1" is detected. Each XOR can only be restored when its inputs no longer drive the output (one of the inputs is in standby, B in this case), and a reset-in (RSTIN) signal is received from the next downstream stage in the tree.

The interlocked restore method offers more circuit robustness and reliability when pulsed signals need to be propagated and evaluated through a multistage system. In order to achieve maximum circuit performance, the XOR function may be implemented with dynamic CMOS (complementary metal-oxide semiconductor) logic.

While the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A low power, high speed, multi-stage asynchronous logic circuit, comprising:

a first logic circuit having a plurality of inputs and an output, the first logic circuit having means for detecting the presence of valid data at its inputs and means for generating a logic output signal;

a second logic circuit having means for detecting the presence of the logic output signal and means for generating a data ready signal; and means for coupling the data ready signal to the first logic circuit for resetting the output of the first logic circuit when the inputs of the first logic circuit have been restored.

2. A logic circuit as in claim 1, wherein said means for detecting valid data includes a plurality of latches respectively communicating with said plurality of inputs of said first logic circuit.

3. A logic circuit as in claim 2, wherein said plurality of latches are in respective communication with TRUE and COMP pins.

4. A logic circuit as in claim 1, wherein said means for generating a logic output signal includes a first NOR gate and a first inverter.

5. A logic circuit as in claim 1, wherein said means for detecting the logic output signal includes a logic means comprising a second NOR gate providing a first input to a first NAND gate, wherein a second input to the first NAND gate is the logic output signal.

6. A logic circuit as in claim 5, wherein said means for generating a data ready signal includes a second inverter at an output of the first NAND gate providing a first input to a second NAND gate, and wherein a second input to the second NAND gate is a reset signal from a downstream XOR.

7. An interlocked restore method for a multistage asynchronous logic circuit having at least first and second logic circuits with respective inputs and outputs, the method comprising the steps of:

detecting, by the first logic circuit, the presence of valid data at its inputs;

generating a logic output signal from said first logic circuit;

detecting, by a second logic circuit, the presence of the logic output signal;

generating a data ready signal from the second logic circuit; and coupling the data ready signal to said first logic circuit for resetting said first logic circuit and its output when the inputs of the first logic signal have been restored.

* * * * *